United States Patent
Ward

(10) Patent No.: US 7,308,657 B2
(45) Date of Patent: Dec. 11, 2007

(54) METHOD FOR GENERATING HINTS FOR PROGRAM ANALYSIS

(75) Inventor: David Ward, Broomfield, CO (US)

(73) Assignee: International Business Machines Corporation, Armonk, NY (US)

( * ) Notice: Subject to any disclaimer, the term of this patent is extended or adjusted under 35 U.S.C. 154(b) by 479 days.

(21) Appl. No.: 11/010,002

(22) Filed: Dec. 10, 2004

(65) Prior Publication Data

US 2006/0129956 A1    Jun. 15, 2006

(51) Int. Cl.
*G06F 17/50* (2006.01)
(52) U.S. Cl. .......................................... 716/4
(58) Field of Classification Search .................. None
See application file for complete search history.

(56) References Cited

U.S. PATENT DOCUMENTS 6,484,134 B1 *  11/2002  Hoskote ..................... 703/14

* cited by examiner

*Primary Examiner*—Leigh M. Garbowski

(57) ABSTRACT

The present invention provides a method, apparatus and article of manufacture for generating hints for use when performing reach-ability analysis of a program such as programmatic representations of hardware circuits. The hints are generated from external inputs to the program which are used in conditional statements of the program. Further such an external input may be excluded from the hints if none of the statements of at least one of the alternative paths following from the conditional statement in which it is used have a data dependency to another statement of the program.

36 Claims, 11 Drawing Sheets

```
S1:  read(x,p2,p6), count = 1
P2:  if (p2==true)
S3:      a = 5
     else
P4:      while count <= 3
S5:          a = 2*count, count++
P6:  if (p6==true)
S7:      b[x] = 3
S8:  else b[x] = 2x
S9:  c = 2* b[x]
```

Fig. 5

| subgraph | p2 | p6 | count | a | b[x] | c |
|---|---|---|---|---|---|---|
| 401 | true | true | 1 | 5 | 3 | 6 |
| 402 | true | false | 1 | 5 | 2x | 4x |
| 403 | false | true | 1,2,3 | 2,4,6 | 3 | 6 |
| 404 | false | false | 1,2,3 | 2,4,6 | 2x | 4x |

| subgraph | p2 | p6 | count | a | b[x] | c |
|---|---|---|---|---|---|---|
| 801 | - | true | 1,2,3 | 5,2,4,6 | 3 | 6 |
| 802 | - | false | 1,2,3 | 5,2,4,6 | 2x | 4x |

901 →  (points to p6 column)
902 →  (points to count, a, b[x], c columns)

S1: read(x,p6)
P6: if (p6==true)
S7: b[x] = 3
S8: else b[x] = 2x

| p6 | x | b[x] |
|---|---|---|
| true | x | 3 |
| false | x | 2x |

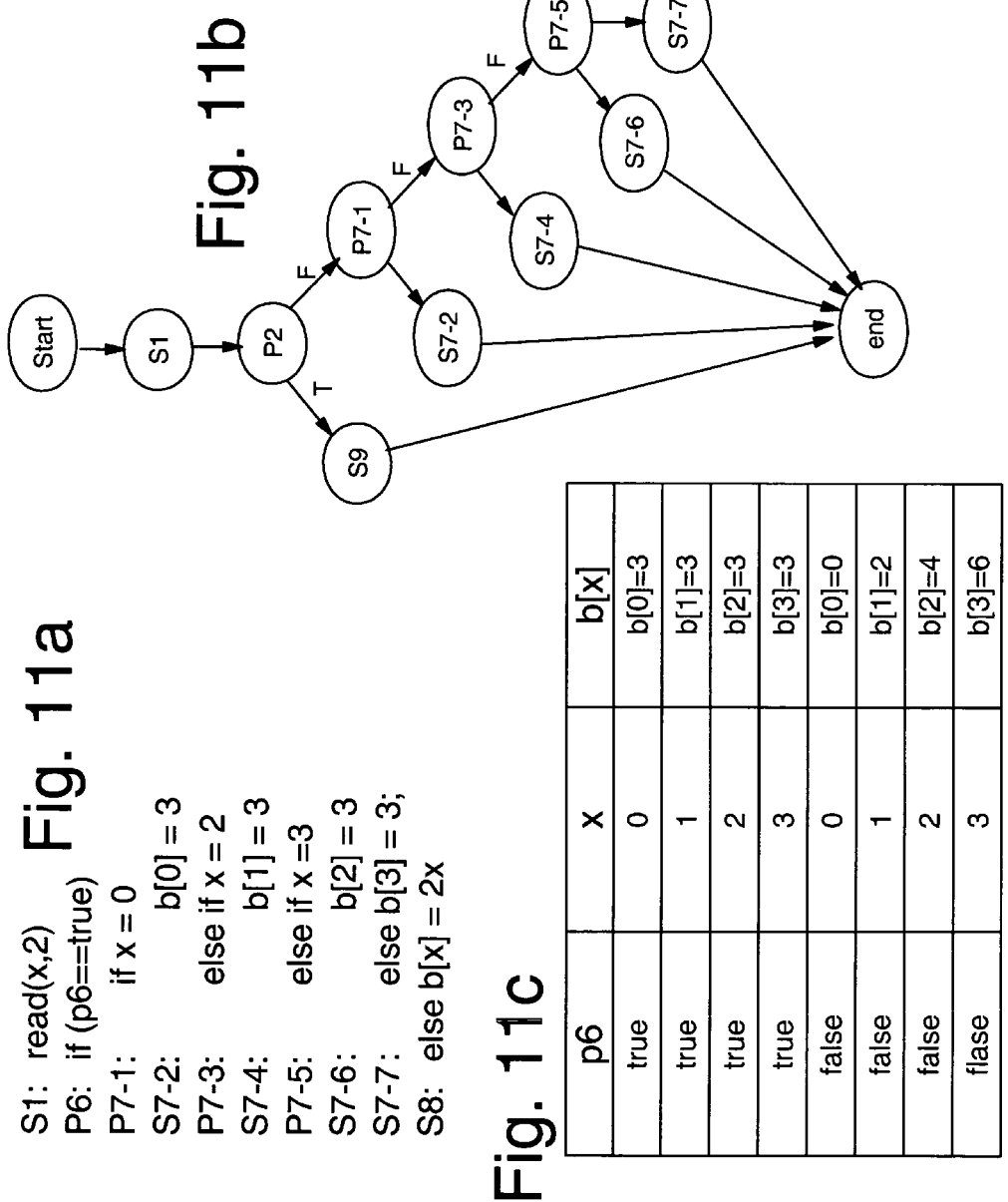

METHOD FOR GENERATING HINTS FOR PROGRAM ANALYSIS

CROSS REFERENCE TO RELATED APPLICATIONS

This application is related to the following co-pending and commonly-assigned patent application, which is hereby incorporated herein by reference in its respective entirety:

"Method for Optimizing Integrated Circuit Device Design and Service" to Ward, having application Ser. No. 11/250,969.

FIELD AND BACKGROUND OF INVENTION

This invention relates to program analysis techniques, and in particular generating hints for use in program analysis, for example, a program which relates to an integrated circuit design.

The design of integrated circuit devices conventionally uses hardware description languages (HDLs) to describe circuits (herein also sometimes called "systems") at various levels of abstraction. As a circuit design evolves, designers and verification engineers (whose job it is to assure that the design functions appropriately) conduct analysis of the device being designed to evaluate the quality of the design and to hopefully find and eliminate any inadequacies potentially leading to future problems such as impossibility or inaccuracy in performance of the device.

One problem encountered in such analysis is referred to as a "state explosion", which occurs when an input to the design, intended to permit analysis of the response of the device to a particular input, generates such a large number of possible output or intermediate states as to overrun any memory used in supporting the analysis.

Reach-ability analysis plays a central role in formal verification of sequential circuits. One of the state-of-the-art approaches for reach-ability analysis and formal verification of circuits modeled as Finite State Machines (FSMs) exploits symbolic computations based on Binary Decision Diagrams (BDDs). However, the known state explosion problem may cause large intermediate BDD sizes during the exploration of the state space of a system. The conventional breadth-first search (BFS) strategy, used in most implicit model checking algorithms, is the main culprit. Others have approached this problem by devising techniques that simplify the system model employed during BFS.

Some recent work in avoiding the state explosion problem during one known analysis procedure, breadth-first symbolic traversal based on Binary Decision Diagrams (BDDs), applies hints to constrain the transition relation of the system to be verified. Hints are expressed as constraints on the primary inputs and states of a circuit modeled as a Finite State Machine (FSM) and can often be found with the help of simple heuristics by someone who understands the circuit well enough to devise simulation stimuli or verification properties for it. However, the ease of finding good hints is limited by the size and complexity of the design, and extending their applicability to larger designs is a key issue.

In one such proposal, "hints" are used to guide the exploration of the state space. In that proposal, hints are classified into those that depend on the invariants being checked (proving properties that should hold in all reachable states of a system) and those that capture knowledge of the design. Hints are applied by constraining the transition relation of the system; the constrained traversal of the state space proceeds much faster than the unconstrained system (original transition relation). This method obtained orders-of-magnitude reductions in time and space requirements during the exploration of the state space. Hints can often be found by someone who understands the design well enough to devise simulation stimuli or verification properties for it. However, in large complex designs, identifying good hints can be a labor-intensive process requiring many attempts, and in most cases does not avoid the state space explosion problem. Acceptance of this method by designers and verification engineers will certainly benefit from a more efficient technique to devise good hints from a system being verified.

Accordingly, in co-pending application Ser. No. 10/966492 a method for generating hints for use in analyzing an original program was disclosed in which: first, the original program is partitioned into sub-programs representing valid computational paths; second, each subprogram is refined when cyclic dependencies are found to exist between the variables; third, computational paths whose over-approximated reachable states are found to be contained in another computational path are merged; and finally, the remaining subprograms conjoined decision conditions become candidates for hints.

In this method the step of partitioning the original program is an important step in controlling the number and quality of the candidate hints produced, and the problem of partitioning the original program is addressed by the present invention.

SUMMARY OF THE INVENTION

Accordingly, according to a first aspect the present invention provides a method comprising: identifying a plurality of conditional statements in a program each conditional statement defining two alternative computational paths of the program; determining a set from the identified conditional statements, the set comprising the conditional statements which are dependant on external inputs to the program; for each conditional statement in the set identifying the values of the external inputs required for each possible condition in the statement to be met; and forming at least one hint, each hint comprising values of the external inputs which would cause a particular condition in each conditional statement in the set to be met thereby defining a computational path of the program.

According to a second aspect the present invention provides a data processing apparatus comprising: a first identifier for identifying a plurality of conditional statements in a program each conditional statement defining two alternative computational paths of the program; a determiner for determining a set from the identified conditional statements, the set comprising the conditional statements which are dependant on external inputs to the program; a second identifier for identifying the values of the external inputs required for each possible condition in each conditional statement in the set to be met; and a former for forming at least one hint, each hint comprising values of the external inputs which would cause a particular condition in each conditional statement in the set to be met thereby defining a computational path of the program.

According to a third aspect the present invention provides an article of manufacture comprising a program storage medium readable by a computer, the medium tangibly embodying one or more programs of instructions executable by a computer to perform a method comprising: identifying a plurality of conditional statements in a program each conditional statement defining two alternative computational paths of the program; determining a set from the identified conditional statements, the set comprising the conditional statements which are dependant on external inputs to the program; for each conditional statement in the set identifying the values of the external inputs required for each possible condition in the statement to be met; and forming at least one hint, each hint comprising values of the external inputs which would cause a particular condition in each conditional statement in the set to be met thereby defining a computational path of the program.

Thus the present invention enables a reduced set of hints to be formed for a program, and which may be used, for example, for performing reach-ability analysis on the program. The reduced set is obtained by considering only external inputs which are used in conditional statements for the purpose of forming the hints.

Preferably, the set of hints are further reduced by not considering external inputs used in conditional statements if one of the alternative paths defined by the conditional statement does not set a value which is used after the alternative paths re-join. Such a dependency on a value set in one statement and used by another statement is known as a data dependency from the statement which sets the value to the statement which used the value. Removing these external inputs from consideration is achieved by identifying data dependencies between statements in the program; and removing a conditional statement from the set of conditional statements, if the statements of at least one alternative path defined by the conditional statement do not have a data dependency to another statement of the program.

According to a fourth aspect the present invention provides a method comprising: identifying a plurality of conditional statements in a program each conditional statement defining two alternative computational paths of the program; identifying data dependencies between statements in the program; determining a set from the identified conditional statements, the set comprising the conditional statements which are dependant on external inputs to the program and for which each alternative path defined by the condition statement has at least one statement which has a data dependency to another statement of the program; for each conditional statement in the set identifying the values of the external inputs required for each possible condition in the statement to be met; and forming at least one hint, each hint comprising values of the external inputs which would cause a particular condition in each conditional statement in the set to be met thereby defining a computational path of the program.

According to a fifth aspect the present invention provides a data processing apparatus comprising: a first identifier for identifying a plurality of conditional statements in a program each conditional statement defining two alternative computational paths of the program; a second identifier for identifying data dependencies between statements in the program; a determiner for determining a set from the identified conditional statements, the set comprising the conditional statements which are dependant on external inputs to the program and for which each alternative path defined by the condition statement has at least one statement which has a data dependency to another statement of the program; a third identifier for identifying the values of the external inputs required for each possible condition in each conditional statement in the set to be met; and a former for forming at least one hint, each hint comprising values of the external inputs which would cause a particular condition in each conditional statement in the set to be met thereby defining a computational path of the program.

According to a sixth aspect the present invention provides an article of manufacture comprising a program storage medium readable by a computer, the medium tangibly embodying one or more programs of instructions executable by a computer to perform a method comprising: identifying a plurality of conditional statements in a program each conditional statement defining two alternative computational paths of the program; identifying data dependencies between statements in the program; and determining a set from the identified conditional statements, the set comprising the conditional statements which are dependant on external inputs to the program and for which each alternative path defined by the condition statement has at least one statement which has a data dependency to another statement of the program; for each conditional statement in the set identifying the values of the external inputs required for each possible condition in the statement to be met; and forming at least one hint, each hint comprising values of the external inputs which would cause a particular condition in each conditional statement in the set to be met thereby defining a computational path of the program.

If the program contains use of array variables which are indexed using an external input this can make it difficult to control the order in which the array elements are used in reach-ability analysis and further can lead to the need for relatively complex representations of the computational paths defined by the hints for the purpose of reach-ability analysis. For example such representations could be a Binary Decision Diagram (BDD), a Boolean function or a truth table. As a result, optionally the method further comprises: identifying a statement which comprises access to an array variable where an external input is used as an index into the array; and adding to the set of conditional statements at least one conditional statement which is conditional on a value of the external variable and which defines a computational path in which the array is accessed using the value as an index. Accordingly access to the array can be defined in a deterministic manner which enables the order in which the array is accessed to be controlled by ordering of hints.

There are many forms in which the program could be represented in order to perform the method required to generate the hints. Optionally a control flow graph is used and the method further comprises: creating a control flow graph to represent the program, the control flow graph comprising decision nodes each of which represent a conditional statement of the program, statement nodes which represent other statements in the program, and arcs which join the nodes based on the program logic; wherein the step of forming a set of identified conditional statements comprises serializing flows from decision nodes which represent conditional statements which are dependant only on internal variables such that the set of identified conditional statements comprise the remaining non-serialized decision nodes of the control flow graph.

Further, if a control flow graph is used, preferably a sub-graph is used to represent a hint. Optionally the method further comprises: dividing the control flow graph into a set of sub-graphs based on the remaining non-serialized decision nodes, each sub-graph representing a computational path through the program as defined by a hint.

For a large complex program or sets of programs it is likely that many hints will be generated and as a result it may be necessary to further reduce the number in the set. In this case preferably the method further comprises discarding hints which do not meet a pre-determined criteria. For example, the pre-determined criteria can specify a number of states which a hint must cause to be reached by the computational path which the hint defines. Alternatively, for example, the pre-determined criteria can be based on the complexity of the representation of the program which is required for performing reach-ability analysis. For example if a binary decision diagram is used the pre-determined criteria can specify a size of a binary decision diagram which represents the computational path defined by a hint.

Preferably a reach-ability analysis of the program is performed using the formed hints.

Note the program could be of any size and could be part of a larger program or sub-program. Further the invention is not restricted by the function which the program performs. For example the program could be a programmatic representation of a hardware circuit such as an integrated circuit design.

BRIEF DESCRIPTION OF DRAWINGS

Some of the purposes of the invention having been stated, others will appear as the description proceeds, when taken in connection with the accompanying drawings, in which:

FIG. 1 is a sample program which is used to describe the preferred embodiment of the present invention;

FIG. 2 is a state table for the program of FIG. 1;

FIG. 3b is a representation of a serialized polar version of the control flow graph of FIG. 3a;

FIG. 5 is a state table for the sub-graphs of FIG. 4;

FIG. 9 is a state table for the sub-graphs of FIG. 8.

FIGS. 10a, b and c are respectively: a sub-section of the program of FIG. 1; a representation of a control flow graph of the program section of FIG. 10a; and a state table for the program section of FIG. 10a;

FIGS. 11a, b and c are respectively: a modified version of the program section of FIG. 11a; a representation of a control flow graph of the program section of FIG. 11a; and a state table for the program section of FIG. 10a.

DETAILED DESCRIPTION OF INVENTION

Figure 3B:
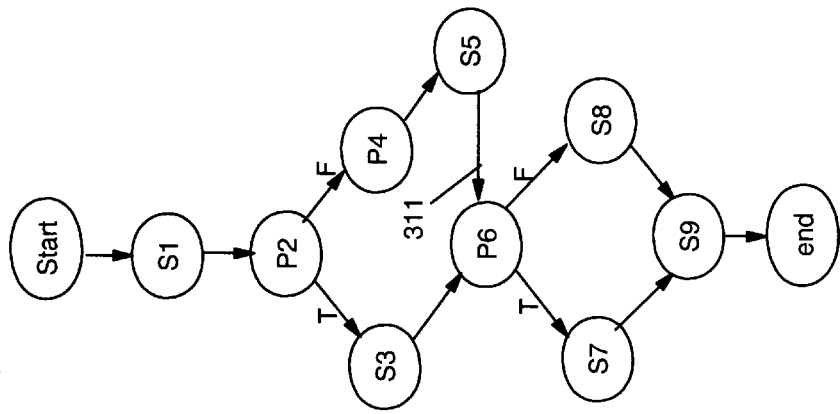

While the present invention will be described more fully hereinafter with reference to the accompanying drawings, in which a preferred embodiment of the present invention is shown, it is to be understood at the outset of the description which follows that persons of skill in the appropriate arts may modify the invention here described while still achieving the favorable results of the invention. Accordingly, the description which follows is to be understood as being a broad, teaching disclosure directed to persons of skill in the appropriate arts, and not as limiting upon the present invention. In particular, while the context for this disclosure is the design of integrated circuit devices, it is known that the "state explosion" problem here addressed is also found in software design and indeed, the invention will be described in terms of software programs. However a skilled person will realize how the technique can be applied to integrated circuit designs, which may for example be expressed in languages such as Verilog.

Co-pending patent application Ser. No. 10/966492 discloses a program analysis technique which uses a control flow graph (CFG) and program dependence graph (PDG) in order to generate hints to be used to perform reach-ability analysis. In this technique program partitioning/slicing is used to identify sub-programs from which the hints are generated. The present invention discloses methods which may be used to perform such program partitioning in a way which reduces the number of candidate hints which are identified using such a process.

FIG. 1 is a simple example program 100 which will be used to illustrate aspects of the preferred embodiment of the present invention. The program 100 is split into sequentially numbered lines which are prefixed with "S" for statements and "P" for predicates (conditional statements). Predicates involve decisions, based on the value of one or more decision variables, which control the flow to the statements. In the program 100 there are three predicate lines/nodes, P2, P4 and P6.

Note that the program illustrated is not intended to adhere to any particular language syntax or to perform any particular useful function, but is merely a program which can be used to demonstrate the present invention. Accordingly a skilled person will realize that the invention could equally be applied to programs other languages and for performing other functions. Further such a program could be, for example, a programmatic representation of a hardware circuit or system such as an integrated circuit design.

FIG. 2 shows a state table diagram for program 100 of FIG. 1. In the table the first 3 columns 201 show the decision variables and the second 5 columns 202 show the states achieved by other variables in the routine if a particular computation path of the program is executed. For example the first row shows the values that a, b(x) and c will achieve if the routine is executed with p2=true, p6=true and count=1. Accordingly it can be seen that the program can reach 12 sets of states each set corresponding a row in the table, each of which represent a different computational path of the program which is defined by a specific combination of the possible values of the decision variables. Note that FIG. 2 does not show the state transitions which may be, for example, encapsulated into a binary decision diagram. For example, for the first 3 states shown in FIG. 2 for p2 and p6 equal to true there are state transitions from the state with count equal to 1 to the state with count=2, to the state with count=3.

In this respect the purpose of a hint is to constrain the decision variables in order to exercise a given computational path in reach-ability analysis, and accordingly from FIG. 2 there are 12 different hints possible.

In the preferred embodiment of the present invention, in order to generate a reduced set of hints, a program to be analyzed is first represented as a control flow graph. FIG. 3a is a control flow graph of program 100 of FIG. 1 in which each node corresponds to a line from the program. The nodes in the control flow graph are joined by arcs which define the flow through the nodes and correspond to the logic of the program 100. Note that in a control flow graph a node can represent a plurality of statements, for example a single node can represent all of the statements between two conditional statements.

The flow graph is then modified and partitioned in order to leave a set of sub-higraphs from which hints are generated. Partitioning is based on internal decision nodes. A variable is an internal decision variable if it does not depend on external inputs. For example, abstract interpretation can be used to identify internal decision variables. A decision node of a control flow graph CFG is an internal decision node if all variables appearing in the predicate attached to the node are internal decision variables. A hint should not constrain internal decision variables, because this may contribute to very few states being reached in reach-ability analysis. Consider, for instance, an internal decision variable that is incremented modulo n at each iteration through the control flow graph. A hint which specifies a value for this variable will allow only one iteration of reach-ability analysis before reaching a fixpoint because as soon as the variable is incremented, all transitions are disabled. In this sense a fixpoint occurs when all states have been reached for a given hint.

Referring to program 100 of FIG. 1, predicates P2 and P6 are predicated on variables p2 and p6, respectively, which were read as inputs at statement S1. As a result p2 and p6 are termed external decision variables because their values are determined externally to the program. However, predicate P4 is predicated on variable count which is set within the program at step S1, and as a result count is termed an internal decision variable. Accordingly, in terms of the control flow graph nodes P2 and P6 are external decision nodes and P4 is an internal decision node, and a hint should not be used to constrain count, the internal decision variable of internal decision node P4.

In the preferred embodiment of the present invention a reduced set of hints is obtained by simplifying the control flow graph and then splitting the simplified flow graph into sub-graphs, each sub-graph corresponding to a potential hint and a computational path of the program. The control flow graph is first simplified by removing all back arcs (note that a back arc is an arc which returns the flow from a node to a previously executed node) to produce a polar graph. The polar graph is then simplified by serializing flows from internal decision nodes to produce a serialized polar graph. For example let V be an internal decision node with children V0 and V1 and U be the corresponding join node with parents U0 and U1. Assume that U0 is a descendant V0 and U1 is a descendant of V1. Then serialization of V replaces its predicate with true; makes V0 the only child of V, makes V1 the successor of U0, and U1 the only parent of U. Which of the two children of V is considered V0 is immaterial. The effect of serialization is to merge paths that should be kept in the same block of the partition into a single path.

Figure 3A:
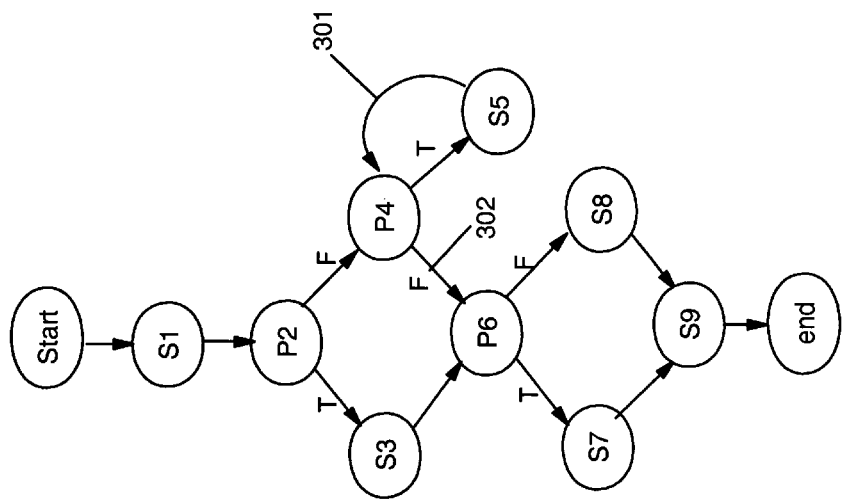
FIG. 3a is a representation of a control flow graph of the program of FIG. 1.

Simplification of the control flow graph of FIG. 3a into a serialized polar graph is shown in FIG. 3b. In FIG. 3b the back arc 301 and arc 302 of FIG. 3a have been removed and new arc 311 added, thus serializing P4, S5 and S6. As a result P4 no longer appears as a decision node in the control flow graph and is no longer a predicate from which a candidate hint will be generated. This effectively reduces the computational paths through the program by considering the section of path contributed by internal decision variables as a single computational path which is contained in other computational paths.

Note that if a decision node uses both an internal decision variable and an external decision variable is not an internal decision node and not suitable as a basis for serialization. In this case the internal decision variables are existentially qualified from the predicate associated with the node before the predicate is used to generate a hint such that the hint does not specify a value for the internal decision variable.

The next step in the preferred embodiment of the present invention is to repeatedly split the control flow graph into a set of sub-graphs. This is achieved by considering a first decision node and creating two sub-graphs, one for each path which follows from the first decision node. This gives a set of two sub-graphs. Next a second decision node is considered, and two sub-graphs are created for each sub-graph in the set, one for each path which follows from the second decision node. This now gives a set of 4 sub-graphs and these steps can be repeated for each decision node in the original control flow graph. Accordingly this produces $2^n$ sub-graphs where n is the number of decision nodes present in the control flow graph and each of the sub-graph represents a computational path through the program.

Figure 4:
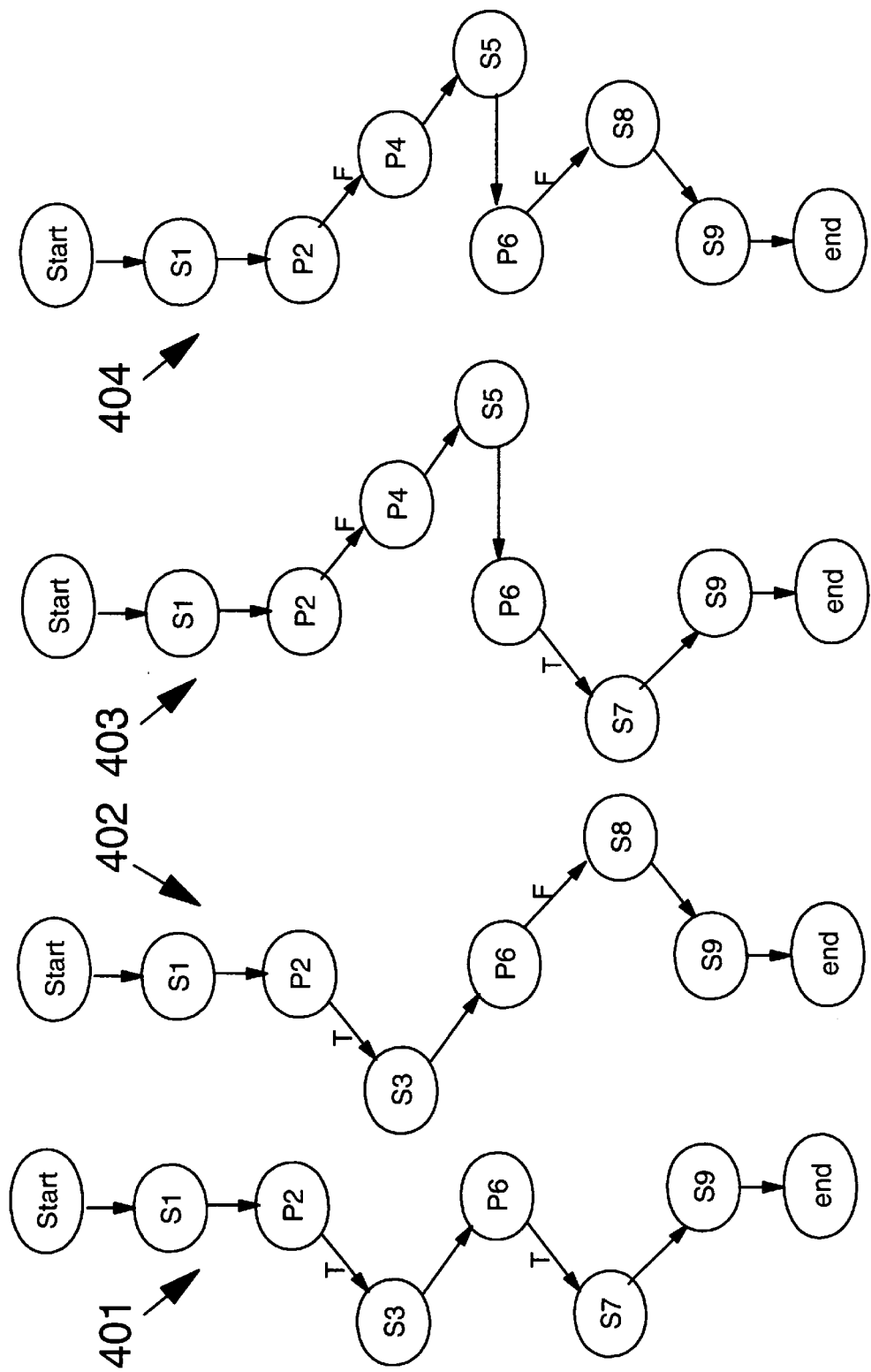
FIG. 4 is a representation of a set of sub-graphs generated from the serialized polar control flow graph of FIG. 3b.

The sub-graphs of the control flow graph of FIG. 3b is shown in FIG. 4. FIG. 3b contains 2 decision nodes, P2 and P6, and as a result FIG. 4 shows 4 sub-graphs which represent each possible computational path through the program defined by the serialized polar control flow graph. Sub-graph 401 represents the path for a hint of p2=true and p6=true, sub-graph 402 represents the path for a hint of p2=true and p6=false, sub-graph 403 represents the path for a hint of p2=false and p6=true, and sub-graph 404 represents the path for a hint of p2=false and p6=false.

Accordingly, FIG. 5 shows an updated state table, compared to that of FIG. 2, with one row for each sub-graph of FIG. 4. In the table the columns 501 represent the external decision variables which may be used to form a hint, and the 5 right hand columns 502 represent the states achieved by other variables in the routine. For example the first row shows the values that count, a, b(x) and c will achieve in the routine is executed with p2=true, p6=true.

Accordingly, for the purposes of reach-ability analysis, there are four candidate hints each of which represent a particular computational path through the program. Further, for each hint, a corresponding Binary Decision Diagram (BDD) of the prior art can be created which represents the states and the transitions between those states, which can be reached by the use of the hint.

However, additional techniques may be used to further reduce the number of candidate hints and to further simplify the BDDs which correspond to the hints. One of these techniques, which involves merging paths based on data dependencies, is illustrated with reference to FIGS. 6 and 7.

Figure 6:
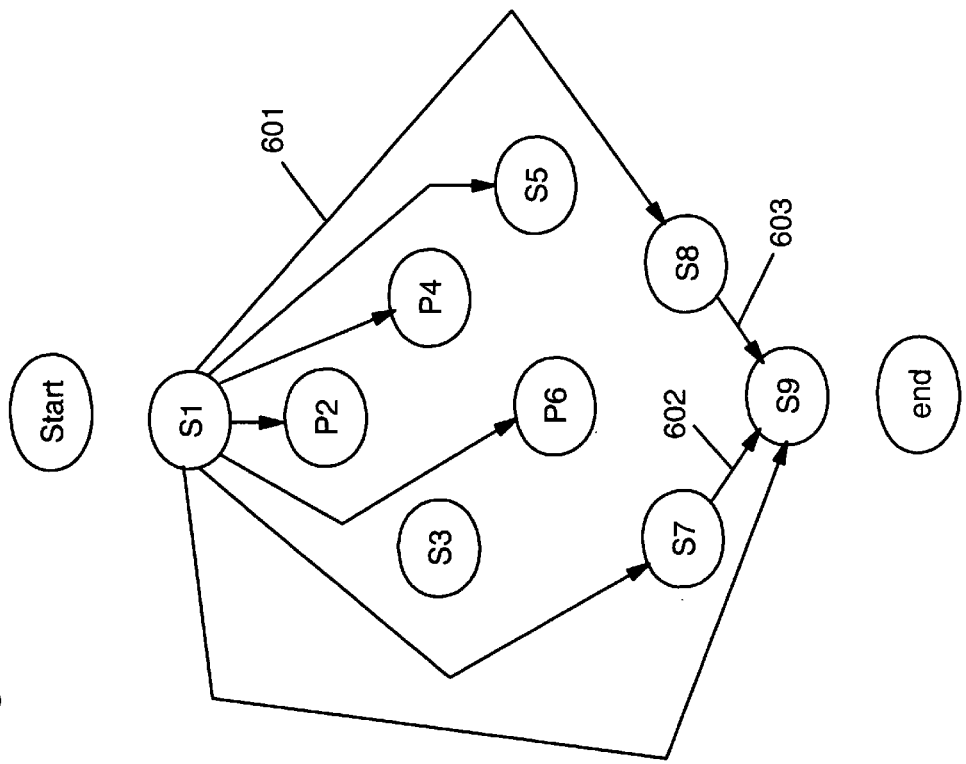
FIG. 6 is a representation of a data dependency graph for the program of FIG. 1.

FIG. 6 is a data dependency graph of the program 100 of FIG. 1. The figures shows the control flow graph of FIG. 3a, but with the arcs replaced with data dependency links. In this graph a link from a first node to a second node shows that the second node uses a variable for which the value is set in the first node. Accordingly, for example, there is a data dependency link 601 from S1 to S8 based on variable x being set in Si and used in S8. From the figure it can also be seen, for example, that there are data dependency links (602, 603) from S7 and S8, respectively, to S9, these links being based on the use of b[x] in S9. The presence of these data dependency links (602, 603) indicate that S7 and S8 cannot be serialized without restricting the number of states for "c" that could be reached by S9. However, with regards to S3 and S5 there are no nodes which have data dependencies on them and as a result the order in which they are run have no effect on the state reached in the later nodes. Accordingly these nodes can be serialized and P2 set to true without affecting states which can be reached, and this is shown, for the serialized polar graph of FIG. 3b, in FIG. 7. In this figure, when compared to FIG. 3b, the arcs from nodes to P2 to P4 and from S3 to P6 have been removed and replaced with an arc 701 from S3 to S4.

Figure 8:
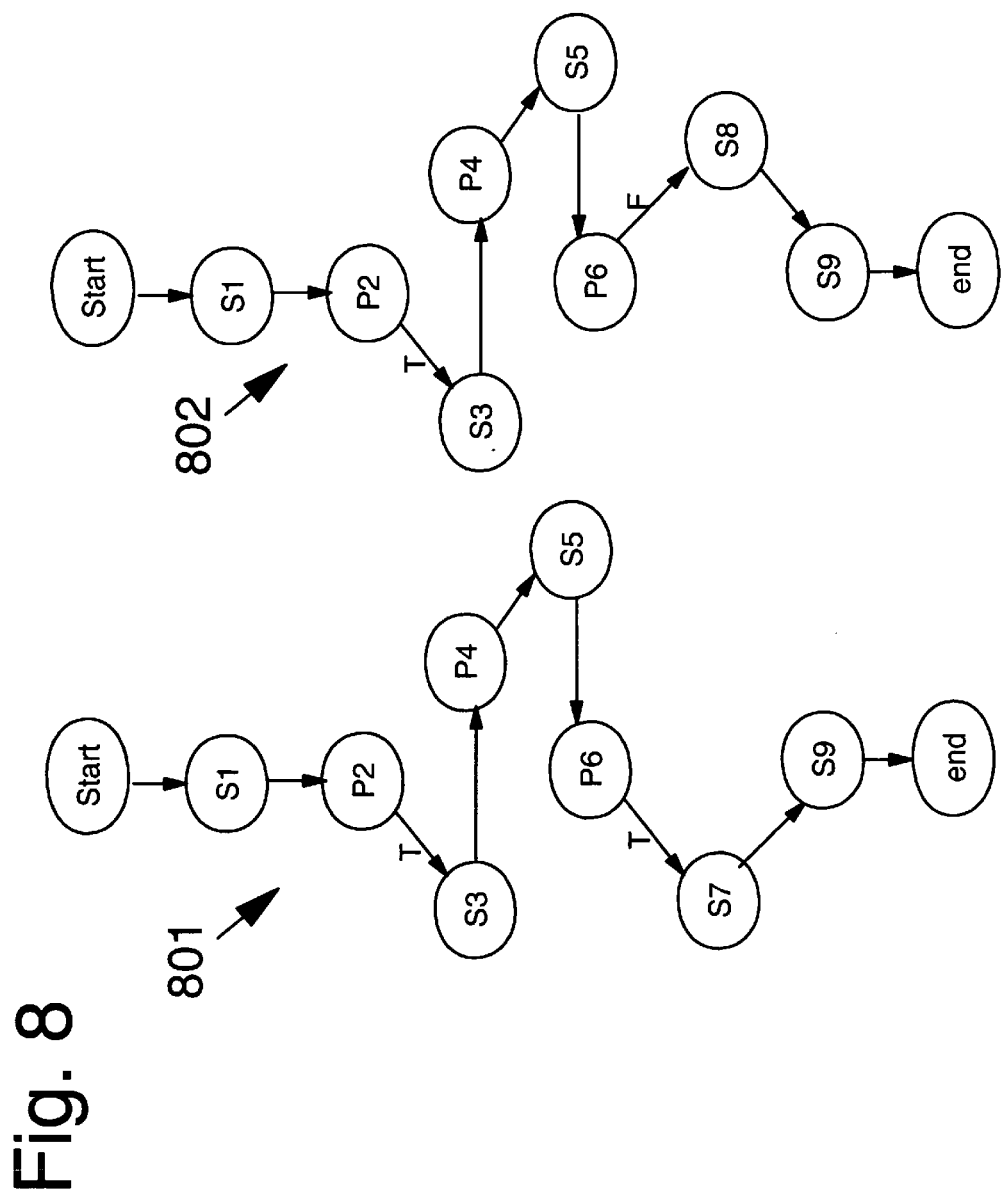
FIG. 8 is a representation of a set of sub-graphs generated from the serialized polar control flow graph of FIG. 7.

As a result of this change to the serialized polar flow graph the number of sub-graphs into which the graph can be split is just two and these are shown in FIG. 8, sub-graph 801 defining a computational path when p6 is true and sub-graph 802 defining a computational path for the case when p6 is false. This now reduces the number of possible hints to 2 and the states which these hints may produce are shown in the table of FIG. 9. In the table it can be seen that more states for "a" can be reached with each hint. Accordingly full reach-ability analysis can be performed with only 2 hints and 2 BDDs, in which the BDD's represent states and state transitions for the paths defined by sub-graphs 801 and 802.

However whereas the states which are reachable for the sub-graph of 801 are completely specified, each being an integer value, the states reachable for sub-graph 802 are not as well specified, the value of b[x] and c, depending on x which is an input variable. As a result of this the BDD for sub-graph 802 is relatively more complex than that of sub-graph 801 and accordingly it can be desirable to produce more hints with simpler BDD's. How this may be done is shown with reference to FIGS. 10a, b, and c, and 11a, b and c.

Figures 10A, 10B, 10C:
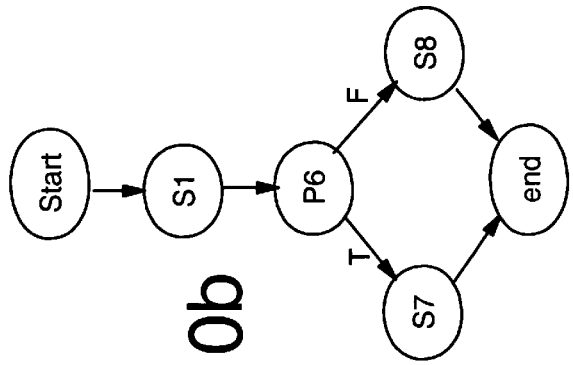

FIG. 10a shows the elements of program 100 of FIG. 1 which relate to the setting of b[x] on lines S7 and S8, FIG. 10b shows the associated control flow graph for these elements, and FIG. 10c shows the table of states based on the possible hints of p6 equal to true and false. Accordingly it can be seen when p6 is true the element of b[] which is set is non-deterministic and when p6 is false both this and the value to which the element is set is non-deterministic.

To simplify the BDD necessary to represent these possible states addressing into an array can be regarded as conditional access to a set of scalar variables. For instance, a[i]:=0 corresponds to a[0]:=0 if i=0; a[1]:=0 if i=1; a[2]:=0 if i=2, and so on. Accordingly, for example if it is known that b[] has up to 4 elements, the program of FIG. 10a can be replaced with the code shown in FIG. 11a, in which statement S7 has been replaced with statements P7-1, S7-2, P7-3, S7-4, P7-5, S7-6 and S7-7. This produces the control flow graph shown in FIG. 11b and the state table shown in FIG. 11c. Note that the flow graph is now more complex with 3 additional decision nodes resulting in 8 possible hints. However all states are now deterministically specified which has the effect that the BDD's which must be created and used with the hints for reach-ability analysis are relatively straight forward.

Note that this interpretation of array accesses is also required in cases in which hints need to prescribe the order in which array elements should be enabled. (Such hints are sometimes effective in the presence of symmetry, since they help reducing the sizes of BDDs that otherwise would encode all permutations of certain set of states.) However, in case of large arrays, expanding their accesses into a series of conditional accesses to scalars may greatly increase the number of paths. Therefore, the expansion is not initially performed. This has the effect of ignoring the address variable in the hints. If the resulting sub-graphs time out during their evaluation by reach-ability analysis, then the array assignments are gradually refined until a set threshold is reached.

Figure 7:
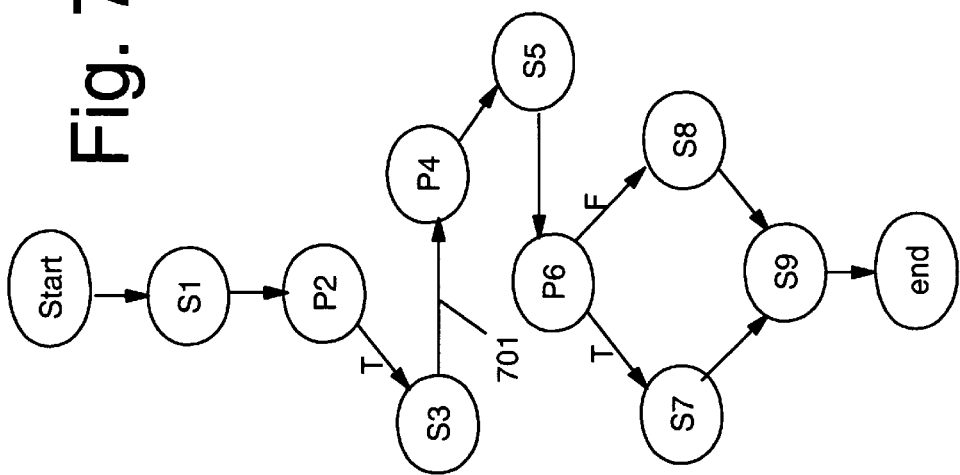
FIG. 7 is representation of a modified version of the serialized polar control flow graph of FIG. 3b in which additional serialization has been applied based on data dependencies.

Further note that whilst this treatment of array access in program 100 increases the number of possible hints to 8, the teaching described with reference to FIGS. 6 and 7 can be applied if it is not desired to control the order in which array element are accessed. Accordingly this will permit the entire flow graph of FIG. 10b to be serialized leaving one hint which can be used to reach all possible states.

Figure 12:
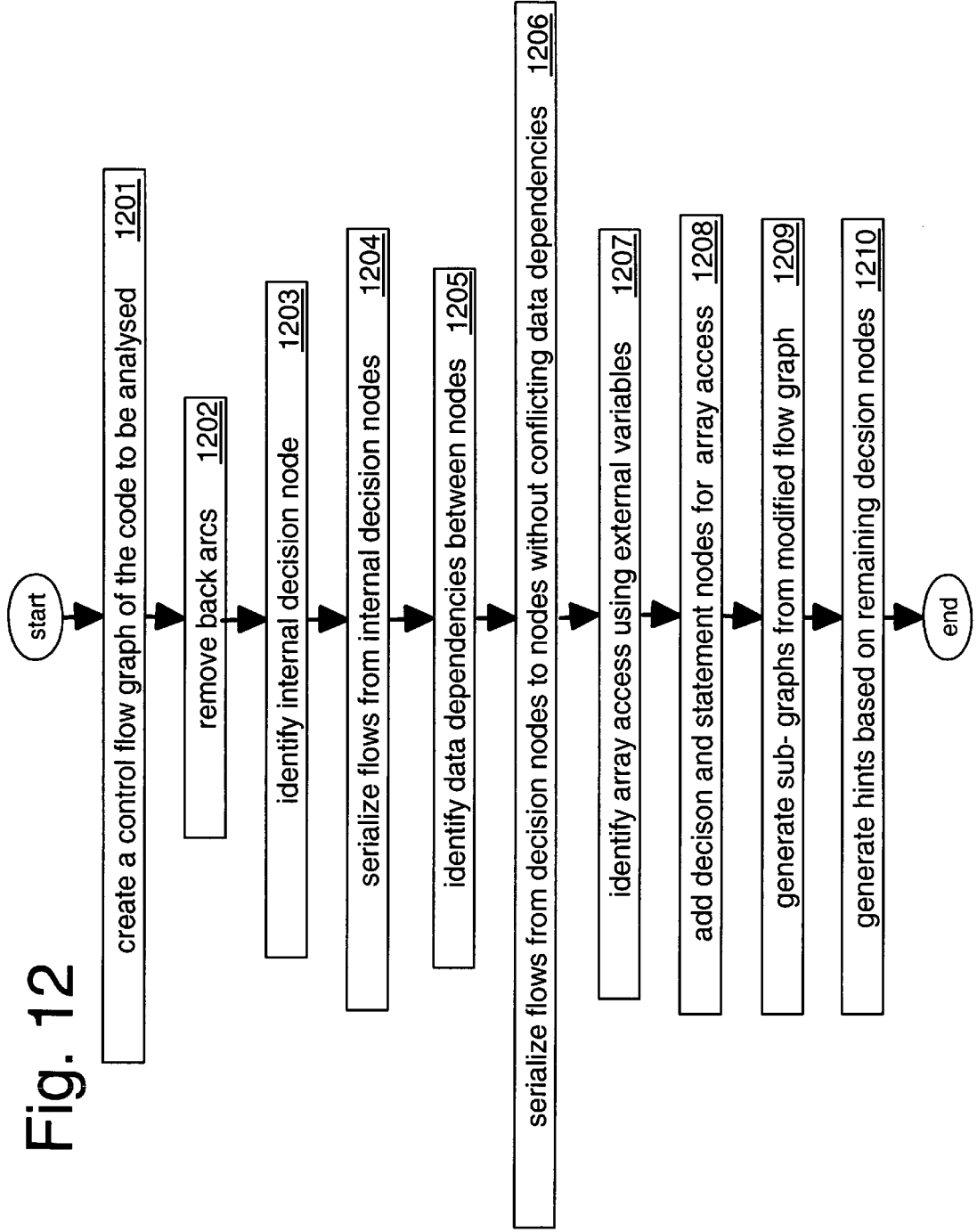
FIG. 12 is a flow diagram of the method of the preferred embodiment of the present invention.

FIG. 12 is a flow chart for generating hints from a program according to the preferred embodiment of the present invention. At step 1201 a control flow graph of the program to be analyzed is created and from this graph, at step 1202, any back arcs are removed to create a polar graph. At step 1203 internal decision nodes are identified and at step 1204 the flows from the identified internal decision nodes are serialized to create a serialized polar graph. At step 1205 data dependencies are identified between the nodes of the control flow graph and a step 1206 flows are serialized from decision nodes to nodes without conflicting data dependencies. At step 1207 access to array elements based on use of an external variable as an index into the array are identified and at step 1208 this access is modifed to an appropriate set of decision and statement nodes. Note that optionally after completing step 1208, step 1206 may be repeated for the decision nodes added. This process results in a modified version of the control flow graph created at step 1201 and this modified version is split into sub-graphs at step 1209 by splitting paths from remaining decision nodes. If there are n such remaining decision nodes this will result in $2^n$ sub-graphs. From these sub-graphs, at step 1210, a set of hints are generated, each of which define a computational path through the program and each of which can be used with an appropriate BDD for performing reach-ability analysis for the program under consideration.

Note that whilst the preferred embodiment is described in terms of a control flow graph, a skilled person will realize that the analysis performed using the control graph could equally be performed using a different representation of the program or the program itself. Further depending on the representation chosen some of the steps performed in the preferred embodiment of the present invention as illustrated in FIG. 12 could be of a conceptual nature. For example whilst at step 1302 back arcs are removed from the control flow graph in another embodiment this may be a logical step which simply means that back arcs will be ignored in subsequent processing.

Further a skilled person will realize that order of the steps described with reference to FIG. 13 can be changed, for example step 1302 could be moved to after step 1304 and steps 1307 and 1308 could be moved to before step 1305. Further a skilled person will realize that some steps of FIG. 13 are optional when generating hints, for example steps 1305 to 1308 could be omitted.

Note the whilst the invention has been described in terms of a simple program a skilled person will realize the invention could be applied to a full program, a sub-program or a section of a program or sub-program. Accordingly the term "program" could apply to any of these units, and whichever unit is under consideration the external variables are those which are set external to the unit. Further where the program under consideration is part of a larger program or set of programs, reach-ability analysis can involve hints and associated BDDS from the other programs, such hints and BDD's being organized into a hierarchy based on the hierarchy of the larger program or set of programs.

Note that not all of the hints produced according to the preferred embodiment of the present invention may be used in performing reach-ability analysis of the program under consideration. For example for a reasonably complex program there can be a large number of candidate hints and as a result a selection criteria may be applied in order to reduce the number. For example one such criteria may favor hints which may be used to generate more reachable states. Very often sub-graphs in which variables can be controlled via primary inputs produce the best results. For example consider an assignment: x:=y+z, where y depends on other variables, whereas z is read from an external input. During reach-ability analysis, for any value of x and any value of y there is a value of z such that x=y+z (assuming signed integers.) Hence, the dependency on y is made ineffective by the dependency on z. For example another such criteria could favor hints which require smaller BDDs for the transition relations for the corresponding models.

Note that whilst, in the preferred embodiment it has been stated that each hint has an associated BDD which is used in reach-ability analysis, in other embodiments the BDD could be replaced with, for example, a boolean function or a truth table.

Note that a skilled person in the art will realize that the method described with reference to FIG. 12 could be implemented in a variety of programming languages, for example, Java™, C, and C++ (Java is a registered trademark of Sun Microsystems, Inc. in the United States, other countries, or both). Further a skilled person will realize that once implemented the methods can be stored in a computer program product comprising one or more programs, in source or executable form, on a media, such as floppy disk, CD, and DVD, suitable for loading onto a data processing host and causing the data processing host to carry out the methods. Further a skilled person will realize that the method described with reference to 12 could be embodied in a data processing apparatus which comprises elements each of which carry out one or more of the method steps.

In summary the present invention provides a method, apparatus and article of manufacture for generating hints for use when performing reach-ability analysis of a program such as programmatic representations of hardware circuits. The hints are generated from external inputs to the program which are used in conditional statements of the program. Further such an external input may be excluded from the hints if none of the statements of at least one of the alternative paths following from the conditional statement in which it is used have a data dependency to another statement of the program.

In the drawings and specifications there has been set forth a preferred embodiment of the invention and, although specific terms are used, the description thus given uses terminology in a generic and descriptive sense only and not for purposes of limitation.

What is claimed is:

1. A method comprising:
   identifying a plurality of conditional statements in a program, each conditional statement defining two alternative computational paths of the program;
   determining a set from the identified conditional statements, the set comprising the conditional statements which are dependant on external inputs to the program;
   for each conditional statement in the set, identifying the values of the external inputs required for each possible condition in the statement to be met; and
   forming at least one hint, each hint comprising values of the external inputs which would cause a particular condition in each conditional statement in the set to be met, thereby defining a computational path of the program.

2. The method of claim 1 further comprising:
   identifying data dependencies between statements in the program; and
   removing a conditional statement from the set of conditional statements if the statements of at least one alternative path defined by the conditional statement do not have a data dependency to another statement of the program.

3. The method of claim 1 further comprising:
   identifying a statement which comprises access to an array variable where an external input is used as an index into the array; and
   adding to the set of conditional statements at least one conditional statement which is conditional on a value of the external variable and which defines a computational path in which the array is accessed using the value as an index.

4. The method of claim 1 further comprising:
   creating a control flow graph to represent the program, the control flow graph comprising decision nodes each of which represent a conditional statement of the program, statement nodes which represent other statements in the program, and arcs which join the nodes based on the program logic;
   wherein determining a set from the identified conditional statements comprises serializing flows from decision nodes which represent conditional statements which are dependant only on internal variables such that the set of identified conditional statements comprise the remaining non-serialized decision nodes of the control flow graph.

5. The method of claim 4 further comprising:
   dividing the control flow graph into a set of sub-graphs based on the remaining non-serialized decision nodes, each sub-graph representing a computational path through the program as defined by a hint.

6. The method of claim 5 wherein the pre-determined criteria specifies a size of a binary decision diagram which represents the computational path defined by a hint.

7. The method of claim 1 further comprising:
   discarding a hint which does not meet a pre-determined criteria.

8. The method of claim 7 wherein the pre-determined criteria specifies a number of states which a hint must cause to be generated by the computational path which the hint defines.

9. The method of claim 1 further comprising:
   performing a reach-ability analysis of the program using the at least one hint.

10. The method of claim 1 where in the program is a programmatic representation of a hardware circuit.

11. A method comprising:
    identifying a plurality of conditional statements in a program, each conditional statement defining two alternative computational paths of the program;
    identifying data dependencies between statements in the program;
    determining a set from the identified conditional statements, the set comprising the conditional statements which are dependant on external inputs to the program and for which each alternative path defined by the condition statement has at least one statement which has a data dependency to another statement of the program;
    for each conditional statement in the set, identifying the values of the external inputs required for each possible condition in the statement to be met; and
    forming at least one hint, each hint comprising values of the external inputs which would cause a particular condition in each conditional statement in the set to be met, thereby defining a computational path of the program.

12. The method of claim 11 further comprising:
identifying a statement which comprises access to an array variable where an external input is used as an index into the array; and
adding to the set of conditional statements at least one conditional statement which is conditional on a value of the external variable and which defines a computational path in which the array is accessed using the value as an index.

13. A data processing apparatus comprising:
a first identifier for identifying a plurality of conditional statements in a program, each conditional statement defining two alternative computational paths of the program;
a determiner for determining a set from the identified conditional statements, the set comprising the conditional statements which are dependant on external inputs to the program;
a second identifier for identifying the values of the external inputs required for each possible condition in each conditional statement in the set to be met; and
a former for forming at least one hint, each hint comprising values of the external inputs which would cause a particular condition in each conditional statement in the set to be met, thereby defining a computational path of the program.

14. The apparatus of claim 13 further comprising:
a third identifier for identifying data dependencies between statements in the program; and
a remover for removing a conditional statement from the set of conditional statements if the statements of at least one alternative path defined by the conditional statement do not have a data dependency to another statement of the program.

15. The apparatus of claim 13 further comprising:
a third identifier for identifying a statement which comprises access to an array variable where an external input is used as an index into the array; and
an adder for adding to the set of conditional statements at least one conditional statement which is conditional on a value of the external variable and which defines a computational path in which the array is accessed using the value as an index.

16. The apparatus of claim 13 further comprising:
a creator for creating a control flow graph to represent the program, the control flow graph comprising decision nodes each of which represent a conditional statement of the program, statement nodes which represent other statements in the program, and arcs which join the nodes based on the program logic;
wherein the determiner serializes flows from decision nodes which represent conditional statements which are dependant only on internal variables such that the set of identified conditional statements comprise the remaining non-serialized decision nodes of the control flow graph.

17. The apparatus of claim 16 further comprising:
a divider for dividing the control flow graph into a set of sub-graphs based on the remaining non-serialized decision nodes, each sub-graph representing a computational path through the program as defined by a hint.

18. The apparatus of claim 13 further comprising:
a discarder for discarding hints which do not meet a pre-determined criteria.

19. The apparatus of claim 18 wherein the pre-determined criteria specifies a number of states which a hint must cause to be generated by the computational path which the hint defines.

20. The apparatus of claim 18 wherein the pre-determined criteria specifies a size of a binary decision diagram which represents the computational path defined by a hint.

21. The apparatus of claim 13 further comprising an analyzer for using the at least one hint to perform a reachability analysis of the program.

22. The apparatus of claim 13 wherein the program is a programmatic representation of a hardware circuit.

23. A data processing apparatus comprising:
a first identifier for identifying a plurality of conditional statements in a program, each conditional statement defining two alternative computational paths of the program;
a second identifier for identifying data dependencies between statements in the program;
a determiner for determining a set from the identified conditional statements, the set comprising the conditional statements which are dependant on external inputs to the program and for which each alternative path defined by the condition statement has at least one statement which has a data dependency to another statement of the program;
a third identifier for identifying the values of the external inputs required for each possible condition in each conditional statement in the set to be met; and
a former for forming at least one hint, each hint comprising values of the external inputs which would cause a particular condition in each conditional statement in the set to be met, thereby defining a computational path of the program.

24. The apparatus of claim 23 further comprising:
a fourth identifier for identifying a statement which comprises access to an array variable where an external input is used as an index into the array; and
an adder for adding to the set of conditional statements at least one conditional statement which is conditional on a value of the external variable and which defines a computational path in which the array is accessed using the value as an index.

25. An article of manufacture comprising a program storage medium readable by a computer, the medium tangibly embodying one or more programs of instructions executable by a computer to perform a method for performing a transform equation, the method comprising:
identifying a plurality of conditional statements in a program, each conditional statement defining two alternative computational paths of the program;
determining a set from the identified conditional statements, the set comprising the conditional statements which are dependant on external inputs to the program;
for each conditional statement in the set, identifying the values of the external inputs required for each possible condition in the statement to be met; and forming at least one hint, each hint comprising values of the external inputs which would cause a particular condition in each conditional statement in the set to be met, thereby defining a computational path of the program.

26. The article of manufacture of claim 25, the method further comprising:
identifying data dependencies between statements in the program; and
removing a conditional statement from the set of conditional statements if the statements of at least one alternative path defined by the conditional statement do not have a data dependency to another statement of the program.

27. The article of manufacture of claim 25, the method further comprising:

identifying a statement which comprises access to an array variable where an external input is used as an index into the array; and adding to the set of conditional statements at least one conditional statement which is conditional on a value of the external variable and which defines a computational path in which the array is accessed using the value as an index.

28. The article of manufacture of claim 25, the method further comprising:

creating a control flow graph to represent the program, the control flow graph comprising decision nodes each of which represent a conditional statement of the program, statement nodes which represent other statements in the program, and arcs which join the nodes based on the program logic;

wherein determining a set from the identified conditional statements comprises serializing flows from decision nodes which represent conditional statements which are dependant only on internal variables such that the set of identified conditional statements comprise the remaining non-serialized decision nodes of the control flow graph.

29. The article of manufacture of claim 28, the method further comprising:

dividing the control flow graph into a set of sub-graphs based on the remaining non-serialized decision nodes, each sub-graph representing a computational path through the program as defined by a hint.

30. The article of manufacture of claim 25, the method further comprising:

discarding hints which do not meet a pre-determined criteria.

31. The article of manufacture of claim 30 wherein the pre-determined criteria specifies a number of states which a hint must cause to be generated by the computational path which the hint defines.

32. The article of manufacture of claim 30 wherein the pre-determined criteria specifies a size of a binary decision diagram which represents the computational path defined by a hint.

33. The article of manufacture of claim 25 wherein the method further comprises:

performing a reach-ability analysis of the program using the at least one hint.

34. The article of manufacture of claim 25 where in the program is a programmatic representation of a hardware circuit.

35. An article of manufacture comprising a program storage medium readable by a computer, the medium tangibly embodying one or more programs of instructions executable by a computer to perform a method for performing a transform equation, the method comprising:

identifying a plurality of conditional statements in a program, each conditional statement defining two alternative computational paths of the program;

identifying data dependencies between statements in the program; and determining a set from the identified conditional statements, the set comprising the conditional statements which are dependant on external inputs to the program and for which each alternative path defined by the condition statement has at least one statement which has a data dependency to another statement of the program;

for each conditional statement in the set, identifying the values of the external inputs required for each possible condition in the statement to be met; and forming at least one hint, each hint comprising values of the external inputs which would cause a particular condition in each conditional statement in the set to be met, thereby defining a computational path of the program.

36. The article of manufacture of claim 35, the method further comprising:

identifying a statement which comprises access to an array variable where an external input is used as an index into the array; and adding to the set of conditional statements at least one conditional statement which is conditional on a value of the external variable and which defines a computational path in which the array is accessed using the value as an index.

* * * * *